(12) United States Patent
Cho et al.

(10) Patent No.: US 9,276,103 B2
(45) Date of Patent: Mar. 1, 2016

(54) NITRIDE SEMICONDUCTOR AND FABRICATING METHOD THEREOF

(71) Applicant: LG Electronics Inc., Seoul (KR)

(72) Inventors: Seongmoo Cho, Seoul (KR); Taehoon Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 200 days.

(21) Appl. No.: 13/947,641

(22) Filed: Jul. 22, 2013

(65) Prior Publication Data

US 2014/0054600 A1  Feb. 27, 2014

(30) Foreign Application Priority Data

Aug. 22, 2012 (KR) .......................... 10-2012-0091936

(51) Int. Cl.
*H01L 29/78* (2006.01)
*H01L 29/417* (2006.01)
*H01L 29/423* (2006.01)
*H01L 29/66* (2006.01)
(Continued)

(52) U.S. Cl.
CPC .............. *H01L 29/78* (2013.01); *H01L 29/205* (2013.01); *H01L 29/24* (2013.01); *H01L 29/41725* (2013.01); *H01L 29/42316* (2013.01); *H01L 29/66462* (2013.01); *H01L 29/7786* (2013.01); *H01L 29/2003* (2013.01)

(58) Field of Classification Search
CPC . H01L 29/20; H01L 29/2003; H01L 29/2006; H01L 29/201; H01L 29/205; H01L 29/207; H01L 29/24
See application file for complete search history.

(56) References Cited

U.S. PATENT DOCUMENTS 6,596,418 B2 * 7/2003 Maesaka et al. ............ 428/819.1
6,955,858 B2 * 10/2005 ElMasry et al. .............. 428/698
(Continued)

FOREIGN PATENT DOCUMENTS

JP  2002359256 A  12/2001
JP  2002299249 A  10/2002
(Continued)

OTHER PUBLICATIONS

Machine translation, Ishihara, Japanese Patent Pub. No. 2006-024597, translation date: Apr. 1, 2015; Espacenet, all pages.*
(Continued)

*Primary Examiner* — Victoria K Hall
(74) *Attorney, Agent, or Firm* — Dentons US LLP

(57) ABSTRACT

This specification is directed to a semiconductor device capable of reducing a leakage current by forming a first GaN layer including a plurality of GaN layers and $Fe_xN_y$ layers interposed between the plurality of GaN layers, in a semiconductor device having the first GaN layer, an AlGaN layer, a second GaN layer, a gate electrode, a source electrode and a drain electrode which are deposited in a sequential manner, and a fabricating method thereof.
To this end, a semiconductor device according to one exemplary embodiment includes a first GaN layer, an AlGaN layer on the first GaN layer, a second GaN layer on the AlGaN layer, and a source electrode, a drain electrode and a gate electrode formed on a portion of the second GaN layer, wherein the first GaN layer comprises a plurality of GaN layers and $Fe_xN_y$ layers interposed between the plurality of GaN layers.

15 Claims, 10 Drawing Sheets

(51) Int. Cl.
*H01L 29/205* (2006.01)
*H01L 29/24* (2006.01)
*H01L 29/778* (2006.01)
*H01L 29/20* (2006.01)

(56) References Cited

U.S. PATENT DOCUMENTS

| | | | |
|---|---|---|---|
| 2002/0015864 A1* | 2/2002 | Maesaka et al. | 428/694 TM |
| 2002/0117102 A1* | 8/2002 | Takahashi et al. | 117/84 |
| 2003/0045017 A1* | 3/2003 | Hiramatsu et al. | 438/46 |
| 2008/0230785 A1* | 9/2008 | Murphy et al. | 257/76 |
| 2010/0258845 A1* | 10/2010 | Marui et al. | 257/194 |
| 2011/0240962 A1* | 10/2011 | Ikuta et al. | 257/15 |
| 2013/0014798 A1* | 1/2013 | Nishide et al. | 136/205 |
| 2014/0357066 A1* | 12/2014 | Jeffery | 438/487 |
| 2015/0200257 A1* | 7/2015 | Kim et al. | 257/76 |

FOREIGN PATENT DOCUMENTS

| | | | | |
|---|---|---|---|---|
| JP | 2003077847 A | | 3/2003 | |
| JP | 2006-024597 | * | 1/2006 | ......... H01L 21/205 |
| JP | 2009-021362 | | 1/2009 | |
| JP | 2010-182872 | | 8/2010 | |
| JP | 2010245504 A | | 10/2010 | |
| JP | 2010251414 A | | 11/2010 | |
| JP | 2011-204877 | | 10/2011 | |
| JP | 2011199222 A | | 10/2011 | |
| KR | 10-1103775 | | 1/2012 | |

OTHER PUBLICATIONS

Machine translation, Tanaka, Japanese Patent Pub. No. 2011-199222, translation date: Apr. 1, 2015; JPO & Japio, all pages.*
S. Heikman, et al., Growth of Fe doped semi-insulating GaN by metalorganic chemical vapor deposition, Applied Physics Letters, Jul. 15, 2002, AIP Publishing, vol. 19, No. 3, pp. 439-441.*
Machine translation, Yoshikawa, Japanese Patent Pub. No. 2002-359256, translation date: Mar. 31, 2015, Espacenet, all pages.*
Machine translation, Tanaka, Japanese Patent Pub. No. 2011-204877, translation date: Apr. 1, 2015, Espacenet, all pages.*
Machine translation, Tanaka, Japanese Patent Pub. No. 2010-182872, translation date: Apr. 1, 2015, Espacenet, all pages.*
Machine translation, Inoue, Japanese Patent Pub. No. 2002-299249, translation date: Mar. 31, 2015; Espacenet, all pages.*
Machine translation, Hashimoto, Japanese Patent Pub. No. 2009-021362, translation date: Apr. 1, 2015; Espacenet, all pages.*
Machine translation, Han, Korean Patent Pub. No. KR 10-2010-0057113, translation date: Apr. 1, 2015, KIPO, all pages.*
Machine translation, Notification for Reasons for Refusal, Japan Patent Office, Japanese Patent Application No. 2013-168616 (Aug. 26, 2014), all pages.*
Machine translation, Grant of Patent, KIPO, Korean Patent Application No. 10-2012-0091936 (Dec. 27, 2013), all pages.*

* cited by examiner

NITRIDE SEMICONDUCTOR AND FABRICATING METHOD THEREOF

CROSS-REFERENCE TO RELATED APPLICATION

Pursuant to 35 U.S.C. §119(a), this application claims the benefit of earlier filing date and right of priority to Korean Application No. 10-2012-0091936, filed on Aug. 22, 2012, the contents of which is incorporated by reference herein in its entirety.

BACKGROUND OF THE INVENTION

1. Field of the Invention

This specification relates to a GaN Heterojunction Field Effect Transistor (HFET) device with a $Fe_xN_y$ layer (or interlayer), and a fabricating method thereof.

2. Background of the Invention

A nitride semiconductor exhibits several advantages including high threshold electric field, low On-resistance, high temperature, and high frequency applications. The spotlight to the nitride semiconductor comes from those advantages, and advanced research on nitride semiconductor as a material for the next generation semiconductor device is conducted.

In recent time, mainstream high power devices include MOSFET and IGBT, and also devices such as GaN-based HEMT, HFET, MOSFET and the like are studied.

The HEMT which uses high electron mobility is employed for communication devices exhibiting high frequency performance.

Also, the HEMT is used in power semiconductors, communication devices showing high frequency performance, and the like. In recent time, developments of hybrid/fuel cell cars are ongoing, and various overseas corporations are launching hybrid vehicles. Reliable operations at high temperature are required for semiconductor switches, which are disposed within the voltage booster converter and inverter for connecting a motor to a generator within a hybrid vehicle, due to heat generated from an engine. Gallium nitride (GaN) may allow for reliable operation at the high temperature owing to its wide bandgap, and is suitable for the next generation semiconductor switch within hybrid cars.

FIG. 1 is an exemplary view showing a general structure of Heterojunction Field Effect Transistor (HFET).

As shown in FIG. 1, a general HFET 10 may switch a 2 DEG current which flows from a drain electrode to a source electrode, through a schottky gate electrode.

The general HFET 10 may include a substrate (not shown), a first GaN layer 11 formed on the substrate, an AlGaN layer 12 on the first GaN layer 11, a second GaN layer 13 on the AlGaN layer 12, a gate electrode 14, a source electrode 15 and a drain electrode 16 formed on the second GaN layer 13.

For the general HFET device 10, quality of the schottky characteristic using gate operations may have a great influence on a switch characteristic of the device.

Therefore, a technology for reducing a leakage current of the HFET and maximizing a breakdown voltage is needed.

SUMMARY OF THE INVENTION

Therefore, an aspect of the detailed description is to provide a semiconductor device capable of reducing a leakage current by forming a first GaN layer including a plurality of GaN layers and $Fe_xN_y$ layers interposed between the plurality of GaN layers, in a semiconductor device having the first GaN layer, an AlGaN layer, a second GaN layer, a gate electrode, a source electrode and a drain electrode which are deposited in a sequential manner, and a fabricating method thereof.

To achieve these and other advantages and in accordance with the purpose of this specification, as embodied and broadly described herein, there is provided a semiconductor device including a first GaN layer, an AlGaN layer on the first GaN layer, a second GaN layer on the AlGaN layer, and a source electrode, a drain electrode and a gate electrode formed on a portion of the second GaN layer, wherein the first GaN layer may include a plurality of GaN layers and $Fe_xN_y$ layers interposed between the plurality of GaN layers.

In accordance with one exemplary embodiment, a thickness of the first GaN layer may be in the range of 0.1 um to 10 um.

In accordance with one exemplary embodiment, a thickness of the $Fe_xN_y$ layer may be in the range of 1 nm to 20 nm.

In accordance with one exemplary embodiment, the $Fe_xN_y$ layer may be provided in plurality.

In accordance with one exemplary embodiment, the plurality of GaN layers may be sequentially deposited with the plurality of $Fe_xN_y$ layers interposed therebetween.

In accordance with one exemplary embodiment, the number of $Fe_xN_y$ layers may be in the range of 2 to 20.

In accordance with one exemplary embodiment, the plurality of GaN layers may be doped with a p-type dopant.

In accordance with one exemplary embodiment, the p-type dopant may be at least one of C, Mg and Fe.

In accordance with one exemplary embodiment, a doping amount of the p-type dopant may be in the range of $1\,e^{17}/cm^3$ to $1\,e^{19}/cm^3$.

In accordance with one exemplary embodiment, the p-type dopant may be doped based on a doping profile indicating a doping amount of the p-type dopant in a deposition direction of the first GaN layer.

In accordance with one exemplary embodiment, the doping profile may have a form that the doping amount of the p-type dopant is reduced by a predetermined inclination as being close to the AlGaN layer.

In accordance with one exemplary embodiment, the doping amount of the p-type dopant may be below the least doping amount by a predetermined depth from a lower portion of the AlGaN layer.

In accordance with one exemplary embodiment, the predetermined depth may be in the range of 2 nm to 50 nm.

In accordance with one exemplary embodiment, the least doping amount may be $1\,e^{17}/cm^3$.

In accordance with one exemplary embodiment, the $Fe_xN_y$ layer may have an island form that a plurality of $Fe_xN_y$ crystals are arranged with being spaced in a perpendicular direction to a deposition direction of the first GaN layer.

To achieve these and other advantages and in accordance with the purpose of this specification, as embodied and broadly described herein, there is provided a method for fabricating a semiconductor device, the method including forming a first GaN layer on a substrate, forming an AlGaN layer on the first GaN layer, forming a second GaN layer on the AlGaN layer, and forming a source electrode, a drain electrode and a gate electrode on a portion of the second GaN layer, wherein the first GaN layer may include a plurality of GaN layers sequentially deposited with $Fe_xN_y$ layers interposed therebetween.

In accordance with one exemplary embodiment, the first GaN layer, the AlGaN layer and the second GaN layer may be formed based on at least one of metal organic chemical vapor deposition (MOCVD), molecular beam epitaxy (MBE), hydride vapor phase epitaxy (HVPE), plasma-enhanced chemical vapor deposition (PECVD), sputtering and atomic layer deposition (ALD).

In accordance with one exemplary embodiment, the $Fe_xN_y$ layer may be formed based on Fe source and $Si_3H_4$ gas.

Effect of the Invention

In accordance with one exemplary embodiment of the present disclosure of a semiconductor device and a fabricating method thereof, in a semiconductor device having a first GaN layer, an AlGaN layer, a second GaN layer, a gate electrode, a source electrode and a drain electrode which are deposited in a sequential manner, a leakage current may be reduced by forming the first GaN layer including a plurality of GaN layers and $Fe_xN_y$ layers interposed between the plurality of GaN layers.

Also, in accordance with the semiconductor device disclosed herein, as the $Fe_xN_y$ layer (or an interlayer) is inserted during growth of the nitride thin film (or the first GaN layer) through MOCVD in order to minimize an increase in a leakage current and a reduction of a breakdown voltage, a crystal defect of the nitride may be reduced. Also, the use of Fe p-type dopant may affect a trap formation of the GaN layer so as to reduce a leakage current. Also, even warpage may be reduced according to a growth condition. Therefore, the $Fe_xN_y$ layer may be used as a layer having various advantages and used to fabricate a high power HFET device.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
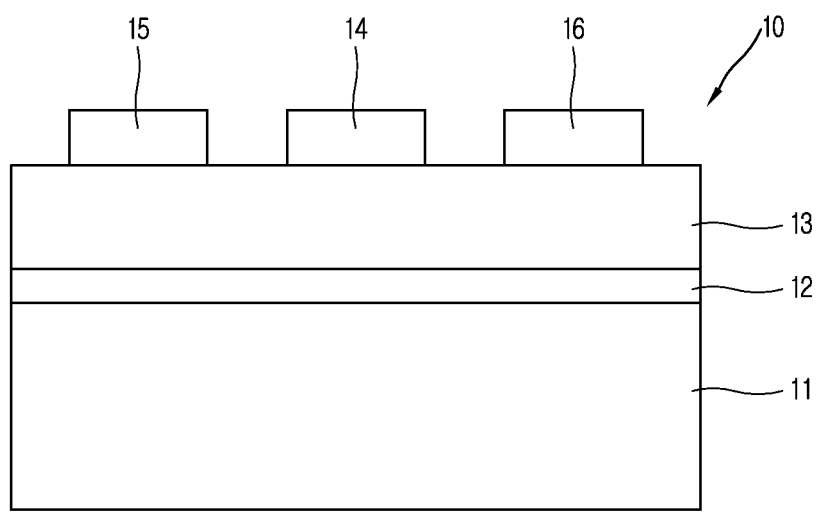
FIG. 1 is an exemplary view showing a general structure of a Heterojunction Field Effect Transistor (HFET)

The technologies disclosed herein may be applied to a Heterojunction Field Effect Transistor (HFET) and a fabricating method thereof. The technologies disclosed herein are not limited to this, and may also be applicable to all kinds of application fields of nitride semiconductors and fabricating methods thereof to which the technological spirit of the technology can be applied.

Especially, the technology of this specification may be applied to a semiconductor device, capable of reducing a crystal defect of nitride by inserting a $Fe_xN_y$ interlayer during growth of nitrides through MOCVD, and reducing a leakage current by using a Fe p-type dopant to affect a trap formation of GaN layers formed on and beneath the interlayer.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

In detail, the present disclosure relates to a nitride semiconductor device and a fabricating method thereof, and more particularly, a method for reducing a leakage current coming from an epitaxial thin film in a heterojunction nitride semiconductor power device.

First, a crystal defect may be minimized in order to reduce a leakage current of a GaN thin film and a p-type dopant may be added in order to improve a semi-insulating function.

Also, a growth condition may be optimized or an interlayer may be inserted during the growth of GaN in order to minimize the crystal defect.

Examples of a material for forming the interlayer within MOCVD thin film growth equipment may include $Si_xN_y$, AlN, $Mg_xN_y$ and the like.

Here, the p-type dopant may be used to enhance the GaN semi-insulating function. For example, sources such as C, Mg, Fe and the like may correspond to the p-type dopant.

Two different reasons of using the interlayer during the GaN growth may be considered. First, upon growing the GaN on a Si substrate, cracks and warpage may be generated due to a difference of a lattice constant and a difference of a thermal expansion coefficient between the two materials. Accordingly, the interlayer may be inserted to reduce the factors, namely, the cracks and the warpage. The role of the interlayer may be more important because it is more apt to cause the generation of the cracks and warpage in a thick GaN. Second, a horizontal growth of the GaN which grows on the interlayer may arise from an island growth of the interlayer. This may result in removal of a dislocation defect caused due to a vertical growth of the GaN. This may have advantages of reducing the dislocation defect and also reducing a leakage current by virtue of the growth of GaN of high quality.

Also, advantages may be achieved in minimizing the warpage or cracks by relaxing stress generated as the GaN grows thick.

Hereinafter, description will be given in detail of the technologies disclosed herein with reference to the accompanying drawings.

Description of Semiconductor Device in Accordance with One Exemplary Embodiment

A semiconductor device in accordance with one exemplary embodiment may include a first GaN layer, an AlGaN layer on the first GaN layer, a second GaN layer on the AlGaN layer, and a source electrode, a drain electrode and a gate electrode all formed on a partial area of the second GaN layer. The first GaN layer may include a plurality of GaN layers and $Fe_xN_y$ layers interposed between the plurality of GaN layers.

Figure 2:
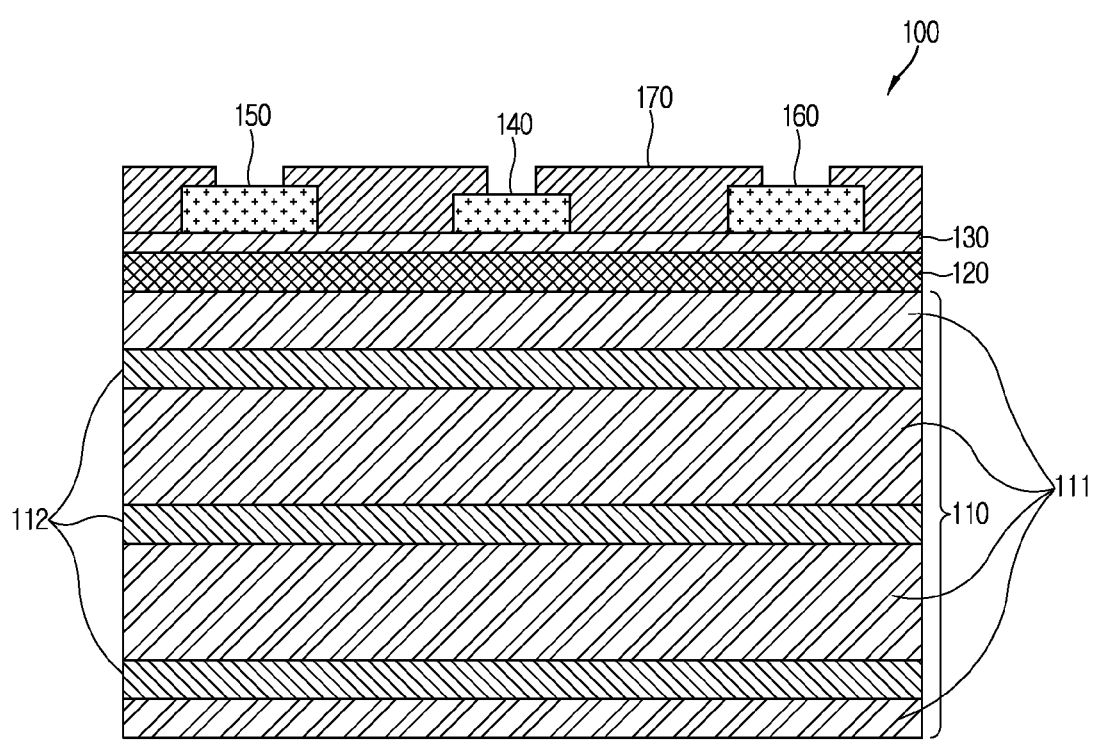
FIG. 2 is an exemplary view showing a structure of a semiconductor device in accordance with one exemplary embodiment.
Figure 7:
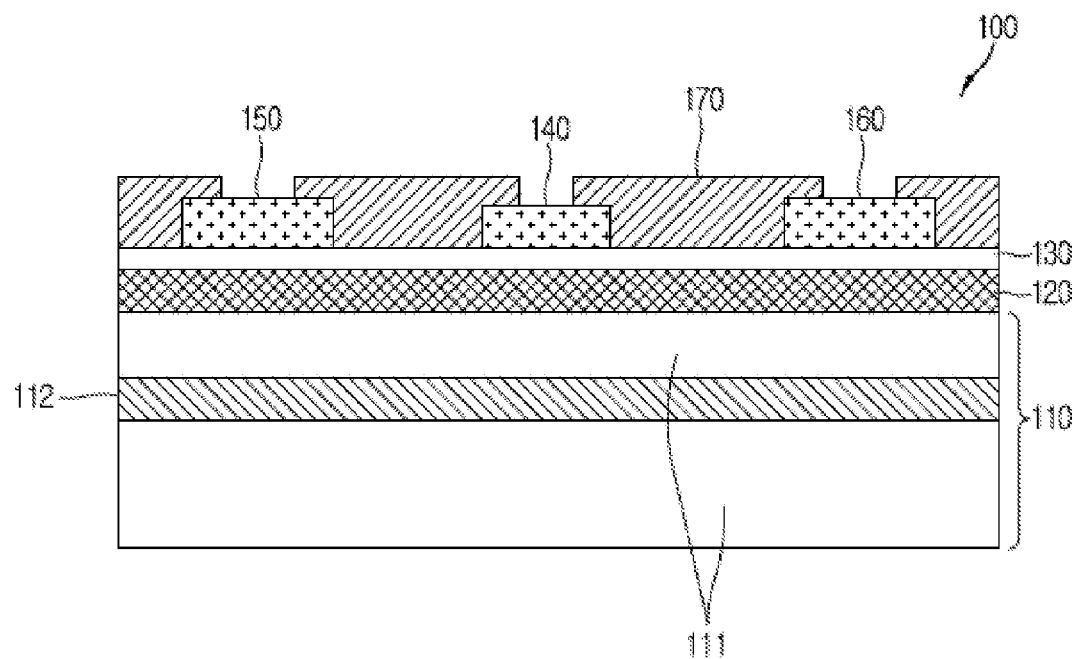
FIG. 7 is an exemplary view showing a structure of a semiconductor device in accordance with one exemplary embodiment.

FIG. 2 is an exemplary view showing a structure of a semiconductor device in accordance with one exemplary embodiment. FIG. 7 is an exemplary view showing a structure of a semiconductor device in accordance with one exemplary embodiment;

As shown in FIG. 2 and FIG. 7, a semiconductor device 100 in accordance with one exemplary embodiment may include a first GaN layer 110, an AlGaN layer 120 on the first GaN layer 110, a second GaN layer 130 on the AlGaN layer 120, and a gate electrode 140, a source electrode 150 and a drain electrode 160 all formed on a partial area of the second GaN layer 120.

The semiconductor device 100, as shown in FIG. 2, may further include an oxide layer 170 for preventing a surface leakage current.

The semiconductor layer 100 according to the one exemplary embodiment may switch 2DEG current, which flows from the drain electrode 160 to the source electrode 150, through a schottky gate electrode.

Here, the first GaN layer 110 may be formed on a substrate (not shown).

In accordance with the one exemplary embodiment, the substrate may be an n-type material, a p-type material or other various types of materials. For example, the substrate may be at least one of an insulating substrate, a sapphire substrate, a GaN substrate, a SiC substrate and a Si substrate. Other than those substrates, it may be obvious to a person skilled in the art that various types of substrates may be applied to the semiconductor device disclosed herein.

Also, the substrate may be removed after fabricating the semiconductor device 100. Therefore, the final structure of the semiconductor device 100 may be a structure without the substrate.

The GaN layer 110 may be made of GaN, and be thick in the range of 0.1 UM to 10 um.

The first GaN layer 110 may be formed in various manners. For example, the first GaN layer 110 may be formed by a method of selectively growing a nitride semiconductor crystal, for example, formed by at least one of metal organic chemical vapor deposition (MOCVD), molecular beam epitaxy (MBE) and hydride vapor phase epitaxy (HVPE). Here, regarding crystallinity of the first GaN layer 110, the MOCVD method may be typically used for device fabrication.

The first GaN layer 110 may include a plurality of GaN layers 111 and $Fe_xN_y$ layers 112 interposed between the plurality of GaN layers 111. For example, the first GaN layer 110 may include one $Fe_xN_y$ layer formed between two GaN layers.

The $Fe_xN_y$ layer (or $Fe_xN_y$ interlayer) 112 may serve to reduce generation of cracks or warpage due to a difference of a lattice constant and a difference of a thermal expansion coefficient between two materials, when GaN grows on an Si substrate.

Therefore, the $Fe_xN_y$ layer 112 may have an advantage of being used to minimize a leakage current by virtue of its functions of improving GaN crystallinity and semi-insulating of Fe p-type dopant.

In accordance with the one exemplary embodiment, the $Fe_xN_y$ layer 112 may be provided in plurality. For example, the number of $Fe_xN_y$ layers 112 may be 2 to 20.

In detail, the plurality of GaN layers 111 may be deposited with the plurality of $Fe_xN_y$ layers 112 interposed therebetween.

For example, as shown in FIG. 2, 3 $Fe_xN_y$ layers 112 may be provided, and in this case, 4 GaN layers 111 may be provided. The first GaN layer 110 may have a structure that the 3 $Fe_xN_y$ layers 112 are inserted between the 4 GaN layers 111.

In the aspect of fabricating a semiconductor device, the first GaN layer 110 may have a structure that the plurality of GaN layers 111 and the plurality of $Fe_xN_y$ layers 112 are grown in a repetitive manner (or in an alternating manner).

In accordance with the one exemplary embodiment, the $Fe_xN_y$ layer 112 may have a thickness in the range of 1 nm to 20 nm.

In accordance with the one exemplary embodiment, the semiconductor device 100 may further include a high-resistivity GaN layer (not shown) formed on the first GaN layer 110 by injecting at least one of C dopant, Fe dopant and Mg dopant. Here, the at least one dopant may be injected in concentration of $1\ e^{17}/cm^3 \sim 1\ e^{19}/cm^3$.

The AlGaN layer 120 may be formed on the first GaN layer 110. The AlGaN layer 120 may serve as an active layer.

In accordance with the one exemplary embodiment, the AlGaN layer 120 may have a thickness in the range 2 nm to 100 nm, and preferably, be adjusted into the range of 15 nm to 30 nm.

The AlGaN layer 120 may be made of various materials and in various compositions. For example, the AlGaN layer 120 may be formed as $Al_xGa_{1-x}N$. Also, it may be obvious to a person skilled in the art that the AlGaN layer 120 is formed of other various materials or in other various compositions.

The second GaN layer 130 may be formed on the AlGaN layer 120 in a manner of growing GaN.

In accordance with the one exemplary embodiment, the second GaN layer 130 may have a thickness in the range of 0 nm to 100 nm, preferably, in the range of 2 nm to 10 nm. The second GaN layer 130 may function to prevent a surface leakage current.

The gate electrode 140, the source electrode 150 and the drain electrode 160 may be formed on the portion of the second GaN layer 130.

As aforementioned, 2DEG current which flows from the drain electrode 160 to the source electrode 150 may be generated by the control of the schottky gate electrode 140.

In accordance with the one exemplary embodiment, the semiconductor device 100 may further include an oxide layer 170 formed on the second GaN layer 130. The oxide layer 170 may serve to reduce the surface leakage current.

Here, the oxide layer 170 may be formed between the source electrode 150 or the drain electrode 160 and the gate electrode 140.

The oxide layer 170 may be made of various materials or in various compositions. For example, the oxide layer 170 may be made of at least one of $SiO_2$, $Si_xN_y$ (for example, $Si_3N_4$), $HfO_2$, $Al_2O_3$, $ZnO$ and $Ga_2O_3$.

In accordance with the one exemplary embodiment, the oxide layer 170 may have a thickness in the range of 2 nm to 200 nm, preferably, in the range of 2 nm to 100 nm.

Also, the oxide layer 170 may be formed in various manners. For example, the oxide layer 170 may be formed by at least one of metal organic chemical vapor deposition (MOCVD), molecular beam epitaxy (MBE), hydride vapor phase epitaxy (HVPE), plasma-enhanced chemical vapor deposition (PECVD), sputtering and atomic layer deposition (ALD).

First Exemplary Embodiment

First GaN Layer Doped with p-Type Dopant

The first exemplary embodiment disclosed herein may be implemented by a part or combination of the configurations or steps included in the foregoing embodiments or combination of the forgoing embodiments. Hereinafter, repetitive description will be omitted to clarify the first exemplary embodiment disclosed herein.

A semiconductor device in accordance with a first exemplary embodiment may include a first GaN layer, an AlGaN layer on the first GaN layer, a second GaN layer on the AlGaN layer, and a source electrode, a drain electrode and a gate electrode on a portion of the second GaN layer. The first GaN layer may include a plurality of GaN layers and $Fe_xN_y$ layers interposed between the plurality of GaN layers.

Also, in accordance with the first exemplary embodiment, the plurality of GaN layers (or the first GaN layer) may be doped with a p-type dopant. The p-type dopant may be doped to improve a semi-insulating function of the plurality of GaN layers.

That is, the first GaN layer may include high-resistivity GaN layers doped with the p-type dopant so as to prevent a leakage current which may be generated on the first GaN layer.

Here, the p-type dopant may be at least one of C, Mg and Fe.

In accordance with the first exemplary embodiment, a doping amount (doping level) of the p-type dopant may be in the range of $1\ e^{17}/cm^3 \sim 1\ e^{19}/cm^3$.

In accordance with the first exemplary embodiment, the p-type dopant may be doped based on a doping profile, which indicates the doping amount of the p-type dopant in a deposition direction (or an epitaxial direction) of the first GaN layer.

Here, the doping profile may be in a form that the doping amount of the p-type dopant is reduced by a predetermined inclination as being close to the AlGaN layer.

Also, in accordance with the first exemplary embodiment, the doping amount of the p-type dopant may be below the least doping amount by a predetermined depth from a lower portion of the AlGaN layer.

The predetermined depth may be in the range of 2 nm to 50 nm. The least doping amount may be $1\ e^{17}/cm^3$.

In accordance with the first exemplary embodiment, the p-type dopant may be doped on at least one of the plurality of GaN layers. Also, the p-type dopant may be doped all over the plurality of GaN layers. When the p-type dopant is doped based on the predetermined doping profile, the predetermined doping profile may have a form of a discontinuous doping profile due to the $Fe_xN_y$ layers.

Hereinafter, description will be given of a semiconductor device doped with a p-type dopant based on a doping profile, with reference to FIG. 3.

Figure 3:
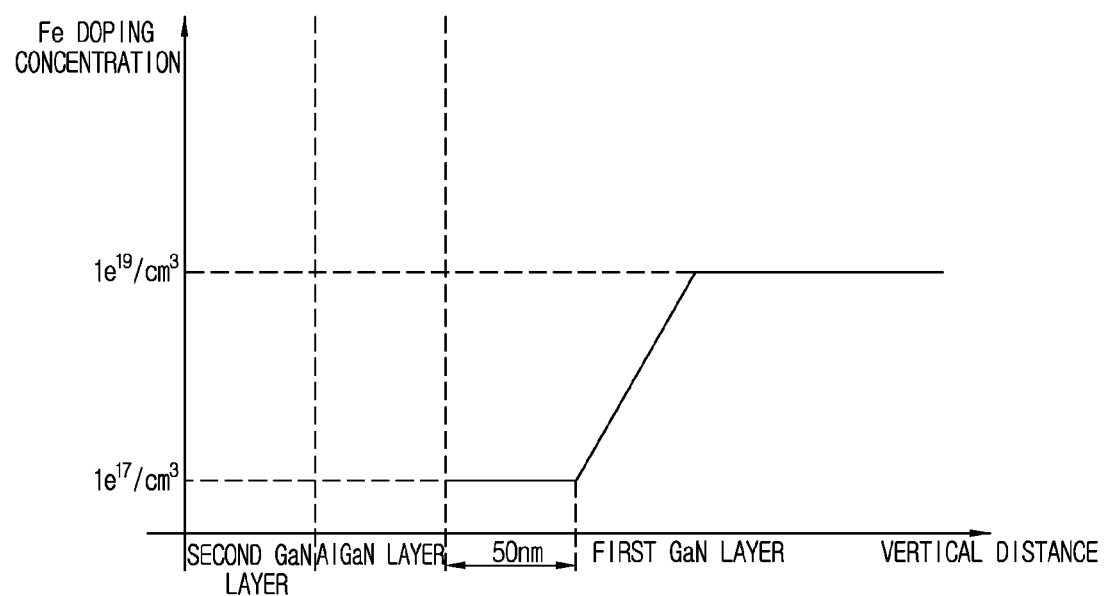
FIG. 3 is an exemplary view showing a doping profile of a p-type dopant in accordance with a first exemplary embodiment.

FIG. 3 is an exemplary view showing a doping profile of a p-type dopant in accordance with a first exemplary embodiment.

As aforementioned, a semiconductor device according to a first exemplary embodiment may include a first GaN layer which is provided with a plurality of GaN layers and $Fe_xN_y$ layers interposed between the plurality of GaN layers.

The first GaN layer may be doped with a p-type dopant, which may result in a reduction of a leakage current which may be generated in a downward direction through the first GaN layer.

The p-type dopant may be at least one of C, Mg and Fe. FIG. 3 exemplarily illustrates the Fe p-type dopant.

In accordance with the first exemplary embodiment, the p-type dopant may be doped based on a doping profile, which indicates the doping amount of the p-type dopant in a deposition direction (or an epitaxial direction) of the first GaN layer.

The doping profile may be drawn into a form of graph which indicates a doping concentration of the p-type dopant in a perpendicular direction (or a downward direction) of the semiconductor device.

Referring to FIG. 3, the semiconductor device according to the first exemplary embodiment may have a doping profile in the form that the doping amount of Fe as the p-type dopant is reduced by a predetermined inclination within the first GaN layer.

Here, the doping concentration (or doping amount) of the Fe within the first GaN layer may be in the range of $1\ e^{17}/cm^3 \sim 1\ e^{19}/cm^3$.

That is, as shown in the doping profile of FIG. 3, the doping concentration of Fe within the first GaN layer may be maintained at $1\ e^{19}/cm^3$ up to a predetermined distance in the deposition direction of the first GaN layer, and then reduced into $1\ e^{17}/cm^3$ by a predetermined inclination from the predetermined distance.

Also, in accordance with the first exemplary embodiment, the doping concentration of the p-type dopant may be below the least doping amount until reaching a predetermined depth from the lower portion of the AlGaN layer.

Here, the predetermined depth may be in the range of 2 nm to 50 nm. Also, the least doping amount may be $1\ e^{17}/cm^3$.

For example, referring to FIG. 3, the doping concentration of the Fe may be 1 $e^{17}/cm^3$, which is the least doping amount, until reaching 50 nm from the lower portion of the AlGaN layer.

The reason of reducing the doping concentration of the p-type dopant (for example, Fe) as being close to the AlGaN layer and the reason that the doping concentration of the p-type dopant may be below the least doping amount are to prevent 2DEG channel from being affected by the doping of the p-type dopant.

In accordance with a variation of the first exemplary variation, when the first GaN layer is formed on the substrate, a type of buffer layer (not shown) may be formed on the substrate. The buffer layer may be formed on the substrate for epitaxial growth of the first GaN layer so as to provide crystallinity (or serve as a type of seed layer). Here, the p-type dopant may be doped, starting from the buffer layer. The buffer layer may be made of various materials. For example, the buffer layer may be made of $Si_3N_4$.

Second Exemplary Embodiment $Fe_xN_y$ Layer in Island Form

The second exemplary embodiment disclosed herein may be implemented by a part or combination of the configurations or steps included in the foregoing embodiments or combination of the forgoing embodiments. Hereinafter, repetitive description will be omitted to clarify the second exemplary embodiment disclosed herein.

A semiconductor device in accordance with a second exemplary embodiment may include a first GaN layer, an AlGaN layer on the first GaN layer, a second GaN layer on the AlGaN layer, and a source electrode, a drain electrode and a gate electrode on a portion of the second GaN layer. The first GaN layer may include a plurality of GaN layers and $Fe_xN_y$ layers interposed between the plurality of GaN layers.

In accordance with the second exemplary embodiment, the $Fe_xN_y$ layer may be disposed in an island form that a plurality of $Fe_xN_y$ crystals are sequentially disposed in a perpendicular direction to a deposition direction (or an epitaxial direction) of the first GaN layer.

Figure 4:
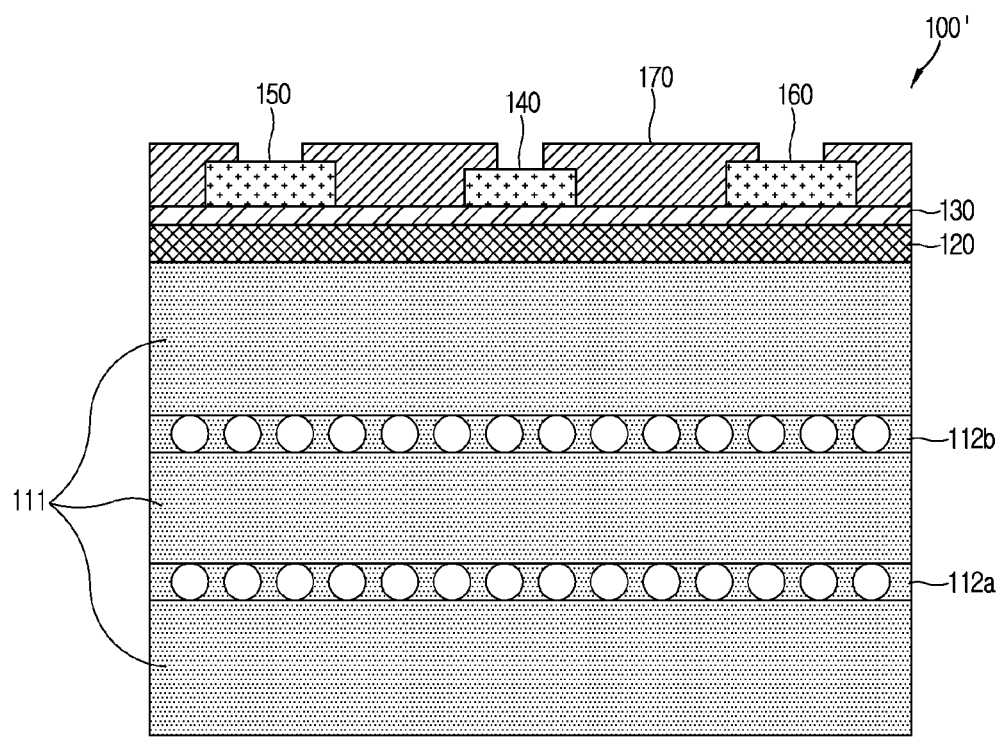
FIG. 4 is an exemplary view showing a semiconductor device in accordance with a second exemplary embodiment.

FIG. 4 is an exemplary view showing a semiconductor device 100' in accordance with a second exemplary embodiment.

As shown in FIG. 4, a semiconductor device 100' according to a second exemplary embodiment may include $Fe_xN_y$ layers in an island form.

The island form may be construed as a generally known meaning in this art. For example, the island form, as shown in FIG. 4, may indicate the form that a plurality of $Fe_xN_y$ crystals are sequentially disposed in a perpendicular direction to the deposition direction of a first GaN layer.

$Fe_xN_y$ layers 112a and 112b grown in the island form may allow for a horizontal growth of the GaN disposed thereon, thus removing a dislocation defect resulted from a vertical growth of the GaN.

Description of Fabricating Method for Semiconductor Device in Accordance with One Exemplary Embodiment A method for fabricating a semiconductor device in accordance with one exemplary embodiment may include forming a first GaN layer on a substrate, forming an AlGaN layer on the first GaN layer, forming a second GaN layer on the AlGaN layer and forming a source electrode, a drain electrode and a gate electrode on a portion of the second GaN layer. Here, the first GaN layer may include a plurality of GaN layers which are spaced apart from one another with $Fe_xN_y$ layers interposed therebetween.

Here, the first GaN layer, the AlGaN layer and the second GaN layer may be formed based on at least one of metal organic chemical vapor deposition (MOCVD), molecular beam epitaxy (MBE), hydride vapor phase epitaxy (HVPE); plasma-enhanced chemical vapor deposition (PECVD), sputtering and atomic layer deposition (ALD).

In accordance with the one exemplary embodiment, the $Fe_xN_y$ layer may be formed based on Fe source and $Si_3H_4$ gas.

Figure 5:
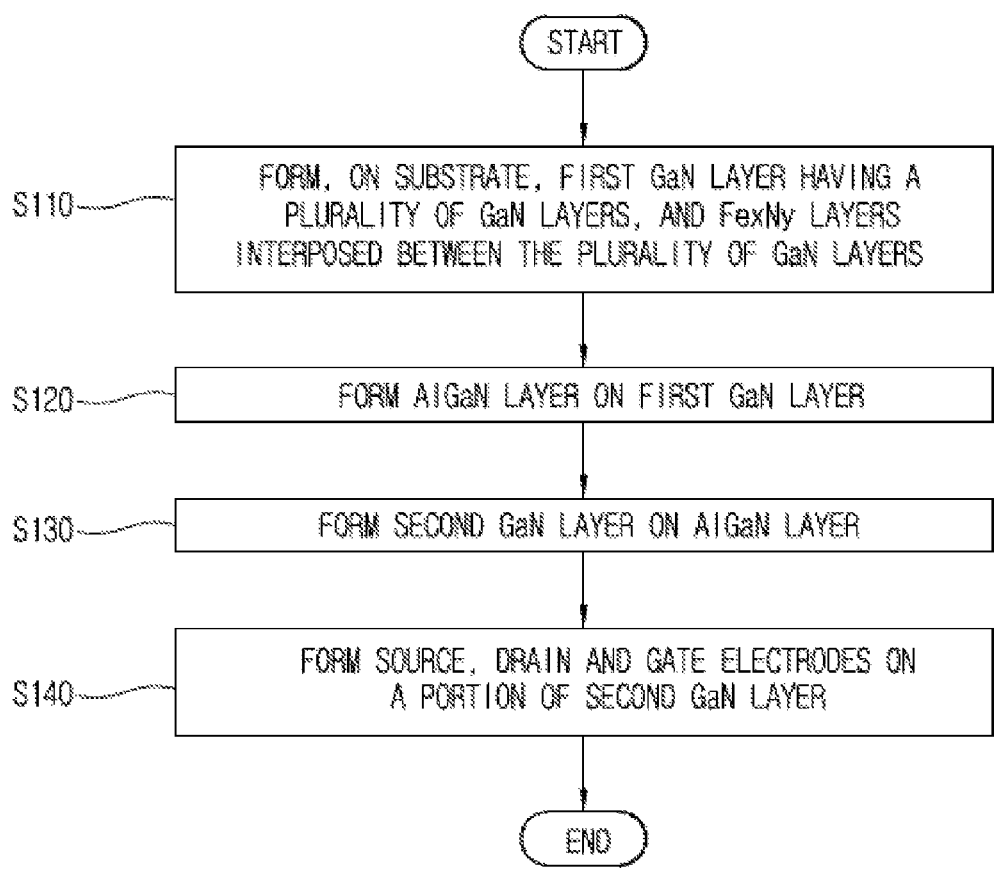
FIG. 5 is a flowchart showing a method for fabricating a semiconductor device in accordance with one exemplary embodiment.

FIG. 5 is a flowchart showing a method for fabricating a semiconductor device in accordance with one exemplary embodiment.

As shown in FIG. 5, a method for fabricating a semiconductor device in accordance with one exemplary embodiment may include the following steps.

First, a first GaN layer may be formed on a substrate. The first GaN layer may include a plurality of GaN layers sequentially deposited with $Fe_xN_y$ layers interposed therebetween (S110).

An AlGaN layer may be formed on the first GaN layer (S120).

A second GaN layer may be formed on the AlGaN layer (S130).

A source electrode, a drain electrode and a gate electrode may be formed on a portion of the second GaN layer (S140).

FIGS. 6A to 6G are exemplary views showing a method for fabricating a semiconductor device in accordance with one exemplary embodiment.

As shown in FIGS. 6A to 6G, a method for fabricating a semiconductor device in accordance with one exemplary embodiment may include depositing a first GaN layer, an AlGaN layer and a second GaN layer in a sequential manner, and forming a gate electrode, a source electrode and a drain electrode on a portion of the second GaN layer. Here, the first GaN layer may include a plurality of GaN layers, and $Fe_xN_y$ layers formed between the plurality of GaN layers, which may thus exhibit a characteristic of a reduced leakage current. To this end, the plurality of GaN layers and the $Fe_xN_y$ layers may be grown in an alternating manner.

Detailed sequence of steps will be described with reference to FIGS. 6A to 6G. First, gallium nitride (GaN) (or a first sub GaN layer) 111a may be grown (or formed) on a substrate (not shown) using MOCVD thin film growing equipment (see FIG. 6A).

The substrate may be an n-type substrate or a p-type substrate, and a kind of substrate may be a Si substrate, a SiC substrate, a sapphire substrate, a GaN substrate or the like.

The GaN forming the first subs GaN layer 111a may be generally fabricated through a metal organic chemical vapor deposition called MOCVD.

Here, TMGa as a raw material of Ga and $NH_3$ as a raw material of N may be synthesized within a reactor at high temperature such that the first sub GaN layer 111a can be grown epitaxially.

Figure 6A:
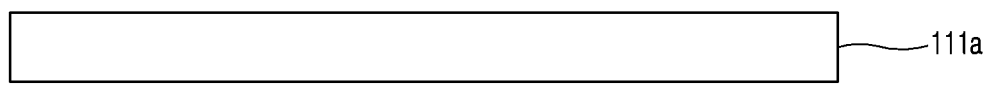
FIGS. 6A to 6G are exemplary views showing a method for fabricating a semiconductor device in accordance with one exemplary embodiment.
Figure 6B:
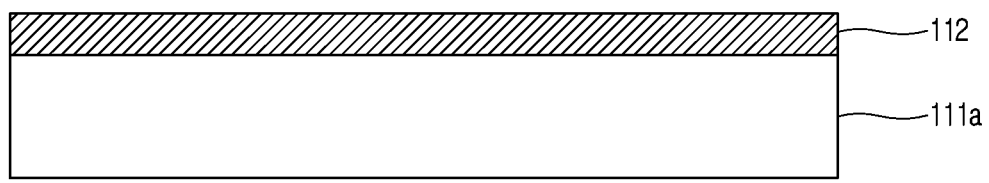

Next, a $Fe_xN_y$ layer 112 may be grown on the first sub GaN layer 111a (see FIG. 6B). The growth of the $Fe_xN_y$ layer 112 may be realized by using Fe source and $Si_3H_4$ gas. A thickness of the $Fe_xN_y$ layer 112 may be in the range of 1 nm to 20 nm, preferably, adjusted into the range of 2 nm to 15 nm.

Figure 6C:
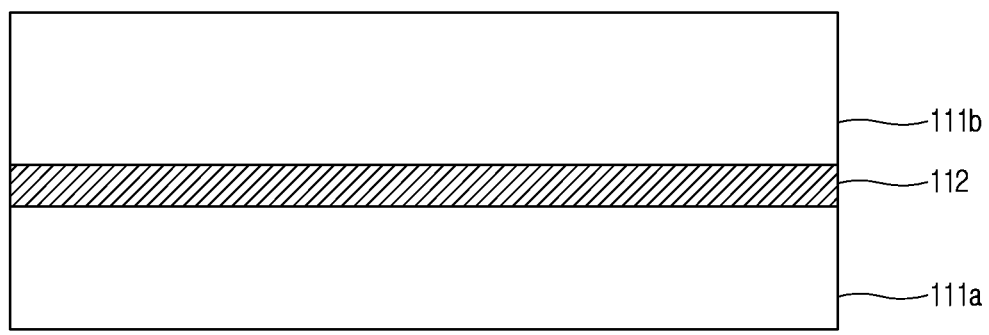

A second sub GaN layer 111b may be grown on the $Fe_xN_y$ layer 112 (see FIG. 6C). The GaN forming the second sub GaN layer 111b may also typically be generated by the metal organic chemical vapor deposition (i.e., MOCVD) similar to the first sub GaN layer 111a.

The first sub GaN layer 111a and the second sub GaN layer 111b may indicate the plurality of GaN layers 111. Hence, the first sub GaN layer 111a, the $Fe_xN_y$ layer 112 and the second sub GaN layer 111b may define the first GaN layer 110.

In accordance with the one exemplary embodiment, the thickness of the first GaN layer (or n-type GaN) 110 may be in the range of 1 to 10 nm.

As aforementioned, a high-resistivity GaN layer (or high-resistivity GaN) for preventing a leakage current may be formed on the first GaN layer 110 using a C, Fe or Mg dopant.

Here, an impurity concentration of the dopant may be in the range of $1\ e^{17}/cm^3$ to $1\ e^{19}/cm^3$, preferably, in the range of $1\ e^{17}/cm^3 \sim 1\ e^{18}/cm^3$.

Figure 6D:
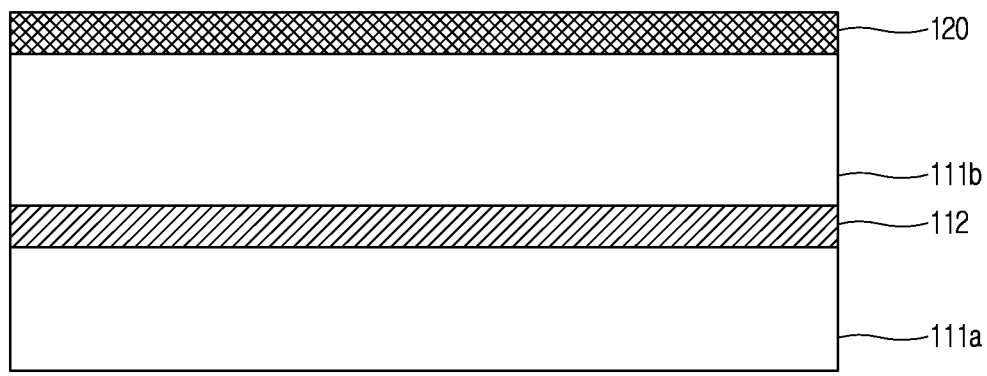

Next, the AlGaN layer 120 as an active layer may be grown after growing the first GaN layer 110 (see FIG. 6D).

In accordance with the one exemplary embodiment, the thickness of the AlGaN layer 120 may be in the range of 2 nm to 100 nm, preferably, in the range of 15 nm to 30 nm.

Figure 6E:
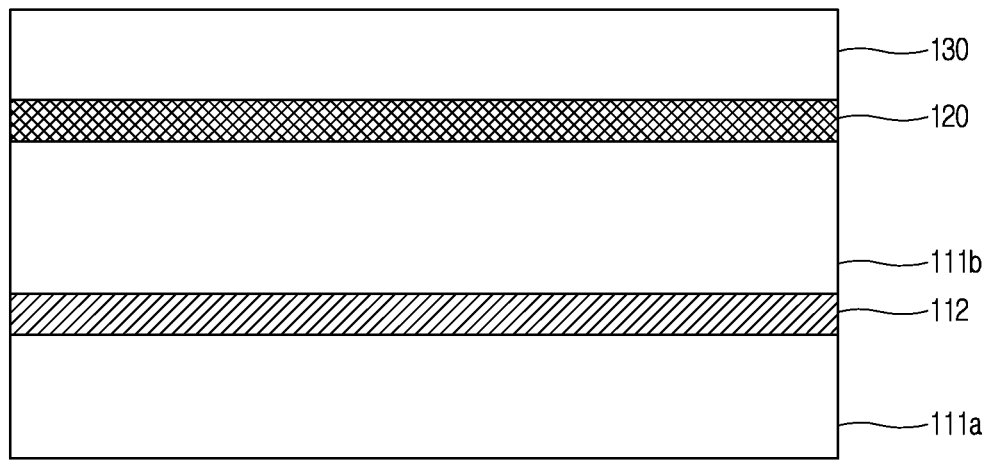

Also, after the growth of the active layer, a second GaN layer (or GaN cap) 130 may be grown to prevent a surface leakage current (see FIG. 6E).

In accordance with the one exemplary embodiment, the thickness of the second GaN layer 130 may be in the range of 0 nm to 100 nm, preferably, in the range of 2 nm to 100 nm.

Figure 6F:
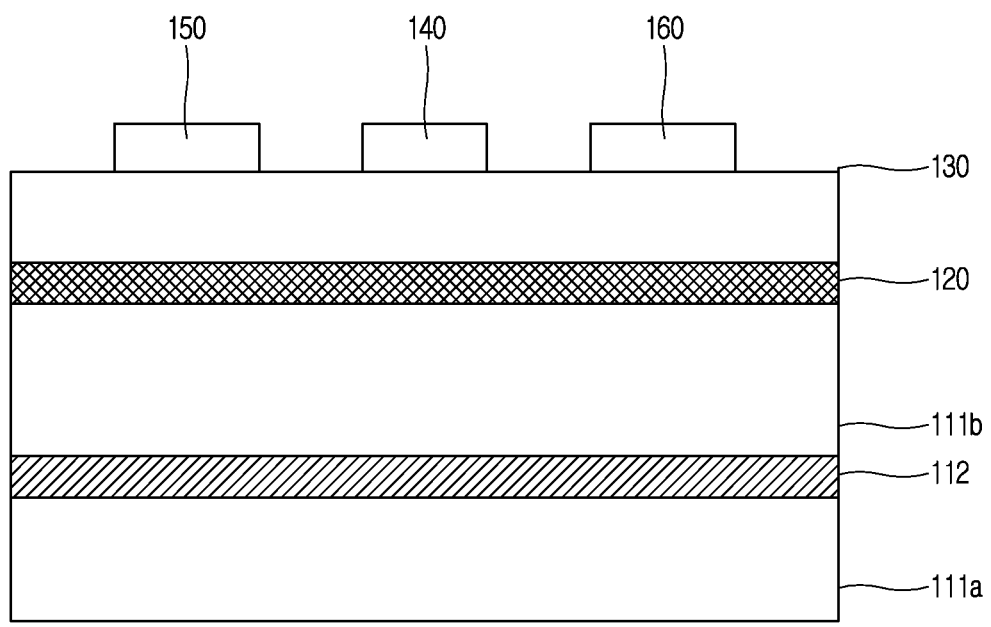
Figure 6G:
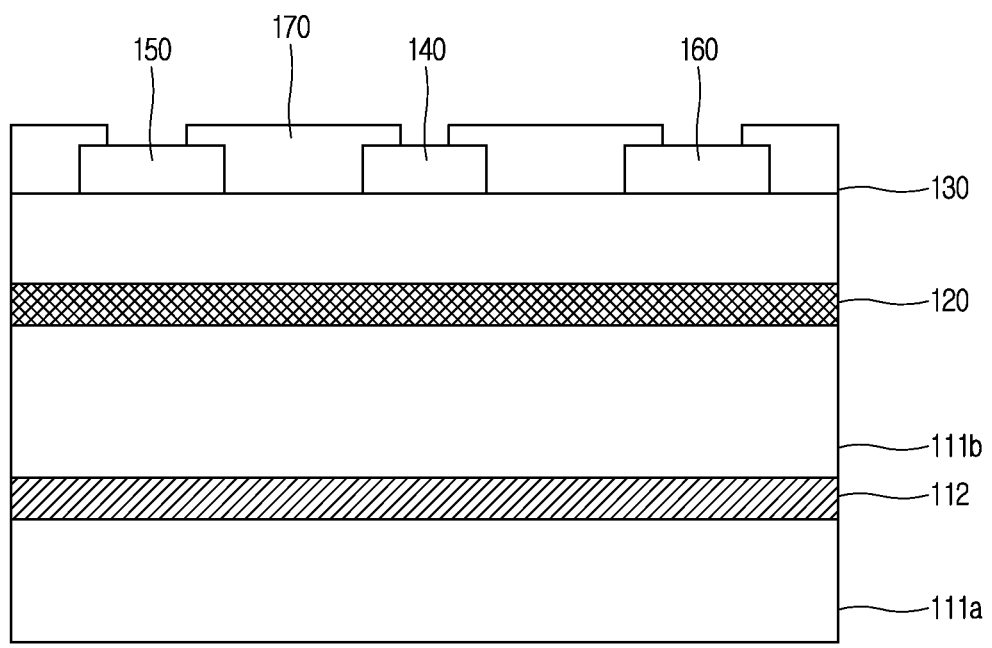

A gate electrode 140, a source electrode 150 and a drain electrode 160 may be formed on a portion of the second GaN layer 130 (see FIG. 6F).

An oxide layer 170 may be formed on the second GaN layer 130.

The oxide layer 170 may serve to reduce the surface leakage current.

Here, the oxide layer 170 may be formed between the source electrode 150 or the drain electrode 160 and the gate electrode 140.

The oxide layer 170 may be made of various materials or in various compositions. For example, the oxide layer 170 may be made of at least one of $SiO_2$, $Si_xN_y$ (for example, $Si_3N_4$), $HfO_2$, $Al_2O_3$, ZnO and $Ga_2O_3$.

In accordance with the one exemplary embodiment, the oxide layer 170 may have a thickness in the range of 2 nm to 200 nm, preferably, in the range of 2 nm to 100 nm.

Also, the oxide layer 170 may be formed in various manners. For example, the oxide layer 170 may be formed by at least one of metal organic chemical vapor deposition (MOCVD), molecular beam epitaxy (MBE), hydride vapor phase epitaxy (HVPE), plasma-enhanced chemical vapor deposition (PECVD), sputtering and atomic layer deposition (ALD).

As described above, the technologies disclosed herein is directed to a method for fabricating a nitride semiconductor HFET device. In detail, the technologies disclosed herein may employ a method using an $Si_xN_y$ or AlN layer (or interlayer) so as to improve crystallinity of a GaN layer below a channel (or DEG channel) or reduce warpage.

Especially, according to the technologies disclosed herein, a $Fe_xN_y$ interlayer may be used to improve GaN crystallinity and plays a part in semi-insulating of Fe p-type dopant, thus to fabricate a nitride HFET device having a minimized leakage current.

The $Fe_xN_y$ layer and the GaN layer may be alternately grown within a range of minimizing the generation of cracks and warpage. The $Fe_xN_y$ layer may be grown into an island form or a single layer. The $Fe_xN_y$ layer may have advantages in various aspects, such as inducing the horizontal growth of the GaN layer disposed thereon to reduce a crystal defect, controlling warpage of the whole thin film according to a growth condition of $Fe_xN_y$, and further reducing the leakage remaining on the GaN layer.

Consequently, in accordance with the semiconductor device disclosed herein, as the $Fe_xN_y$ layer (or an interlayer) is inserted during growth of the nitride thin film (or the first GaN layer) through MOCVD in order to minimize an increase in a leakage current and a reduction of a breakdown voltage, a crystal defect of the nitride may be reduced. Also, the use of Fe p-type dopant may affect a trap formation of the GaN layer so as to reduce a leakage current. Also, even warpage may be reduced according to a growth condition. Therefore, the $Fe_xN_y$ layer may be used as a layer having various advantages and used to fabricate a high power HFET device.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A semiconductor device comprising:
   a first GaN layer;
   an AlGaN layer on the first GaN layer;
   a second GaN layer on the AlGaN layer; and
   a source electrode, a drain electrode, and a gate electrode on a portion of the second GaN layer,
   wherein the first GaN layer comprises a plurality of GaN layers, and one or more $Fe_xN_y$ layers interposed between the plurality of GaN layers.

2. The device of claim 1, wherein a thickness of the first GaN layer is in the range of 0.1 um to 10 um.

3. The device of claim 1, wherein a thickness of the one or more $Fe_xN_y$ layers is in the range of 1 nm to 20 nm.

4. The device of claim 1, wherein the plurality of GaN layers are sequentially deposited with the one or more $Fe_xN_y$ layers interposed therebetween.

5. The device of claim 1, wherein a number of the one or more $Fe_xN_y$ layers is in the range of 2 to 20.

6. The device of claim 1, wherein the plurality of GaN layers are doped with a p-type dopant.

7. The device of claim 6, wherein the p-type dopant is selected from the group consisting of C, Mg, and Fe.

8. The device of claim 6, wherein a doping amount of the p-type dopant is in the range of $1\ e^{17}/cm^3$ to $1\ e^{19}/cm^3$.

9. The device of claim 6, wherein the p-type dopant is doped based on a doping profile indicating a doping amount of the p-type dopant in a deposition direction of the first GaN layer.

10. The device of claim 9, wherein the doping profile has a form that the doping amount of the p-type dopant is reduced in GaN layers of the plurality of GaN layers that are closer to the AlGaN layer.

11. The device of claim 6, wherein the doping amount of the p-type dopant is smaller than $1\ e^{17}/cm^3$ by a predetermined depth from a lower portion of the AlGaN layer,
  wherein the predetermined depth is in the range of 2 nm to 50 nm.

12. The device of claim 1, wherein the one or more $Fe_xN_y$ layers have an island form that a plurality of $Fe_xN_y$ crystals are sequentially arranged in a direction perpendicular to the deposition direction of the first GaN layer.

13. A method for fabricating a semiconductor device comprising:
  forming a first GaN layer on a substrate;
  forming an AlGaN layer on the first GaN layer;
  forming a second GaN layer on the AlGaN layer; and
  forming a source electrode, a drain electrode, and a gate electrode on a portion of the second GaN layer,
  wherein the first GaN layer comprises a plurality of GaN layers and one or more $Fe_xN_y$ layers interposed between the plurality of GaN layers.

14. The method of claim 13, wherein the first GaN layer, the AlGaN layer, and the second GaN layer are formed based on at least one of metal organic chemical vapor deposition (MOCVD), molecular beam epitaxy (MBE), hydride vapor phase epitaxy (HVPE), plasma-enhanced chemical vapor deposition (PECVD), sputtering, and atomic layer deposition (ALD).

15. The method of claim 13, wherein the one or more $Fe_xN_y$ layers are formed based on a Fe source and $Si_3H_4$ gas.

* * * * *